(12) United States Patent
Choi

(10) Patent No.: US 7,547,598 B2
(45) Date of Patent: Jun. 16, 2009

(54) METHOD FOR FABRICATING CAPACITOR IN SEMICONDUCTOR DEVICE

(75) Inventor: Hyung-Bok Choi, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 56 days.

(21) Appl. No.: 11/519,018

(22) Filed: Sep. 12, 2006

(65) Prior Publication Data

US 2007/0161200 A1   Jul. 12, 2007

(30) Foreign Application Priority Data

Jan. 9, 2006   (KR) .................... 10-2006-0002139
Jul. 21, 2006  (KR) .................... 10-2006-0068467

(51) Int. Cl.
*H01L 21/8242* (2006.01)
(52) U.S. Cl. ............... 438/239; 438/243; 257/E21.008
(58) Field of Classification Search ............... 438/239; 257/E21.008
See application file for complete search history.

(56) References Cited

U.S. PATENT DOCUMENTS 5,362,526 A * 11/1994 Wang et al. .................. 427/573
6,051,508 A *  4/2000 Takase et al. ................ 438/724
6,114,198 A *  9/2000 Huang et al. ................ 438/239

(Continued)

FOREIGN PATENT DOCUMENTS

KR    10-2000-0045311 A    7/2000

(Continued)

OTHER PUBLICATIONS

Notice of Preliminary Rejection from the Korean Intellectual Property Office, mailed Jun. 18, 2007 in Korean Patent Application No. 2006-0068467 and English translation thereof.

(Continued)

*Primary Examiner*—Marcos D. Pizarro
*Assistant Examiner*—Igwe U. Anya
(74) *Attorney, Agent, or Firm*—Finnegan, Henderson, Farabow, Garrett & Dunner, L.L.P.

(57) ABSTRACT

A method for fabricating a capacitor in a semiconductor device includes forming a first insulation layer over a substrate, forming storage node contact plugs in the first insulation layer, contacting predetermined portions of the substrate, forming a second insulation layer over the first insulation layer and the storage node contact plugs, forming trenches exposing the storage node contact plugs, forming storage nodes in the trenches, forming a plasma barrier layer over the second insulation layer and the storage nodes, forming a capping layer over the plasma barrier layer and filled in the trenches, removing the capping layer, the plasma barrier layer, and the second insulation layer, forming a dielectric layer over the storage nodes, and forming a plate electrode over the dielectric layer.

28 Claims, 9 Drawing Sheets

U.S. PATENT DOCUMENTS

| | | | |
|---|---|---|---|
| 6,238,968 B1* | 5/2001 | Yu et al. | 438/253 |
| 6,258,691 B1* | 7/2001 | Kim | 438/398 |
| 6,259,127 B1* | 7/2001 | Pan | 257/301 |
| 6,436,786 B1* | 8/2002 | Tsuzumitani et al. | 438/396 |
| 6,465,351 B1* | 10/2002 | Jeong | 438/689 |
| 6,884,692 B2* | 4/2005 | Rhodes et al. | 438/399 |
| 2001/0044179 A1* | 11/2001 | Kim | 438/243 |
| 2002/0092657 A1* | 7/2002 | Cook et al. | 166/382 |
| 2004/0256652 A1* | 12/2004 | Zheng | 257/296 |
| 2005/0124149 A1* | 6/2005 | Kim et al. | 438/618 |
| 2006/0032833 A1* | 2/2006 | Kawaguchi et al. | 216/37 |
| 2006/0141788 A1* | 6/2006 | Yoon | 438/689 |
| 2006/0183297 A1* | 8/2006 | Mun et al. | 438/459 |
| 2007/0004218 A1* | 1/2007 | Lee et al. | 438/756 |
| 2007/0031999 A1* | 2/2007 | Ho et al. | 438/142 |
| 2007/0045769 A1* | 3/2007 | Bian et al. | 257/510 |

FOREIGN PATENT DOCUMENTS

KR    10-2005-0032435 A    4/2005

OTHER PUBLICATIONS

English language translation of the first Office Action issued from the State Intellectual Property Office of the People's Republic of China on Jul. 11, 2008, in counterpart Chinese Application No. 2006101541151.

* cited by examiner

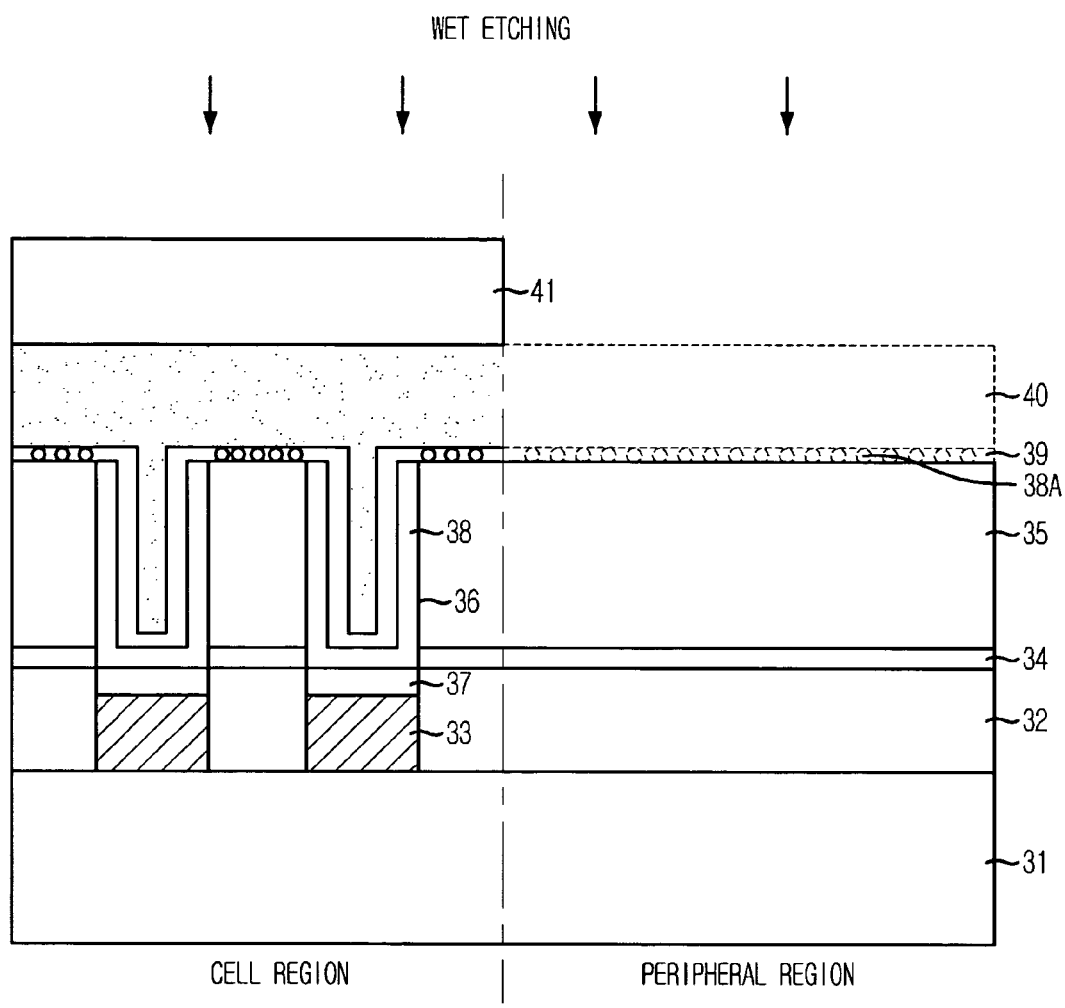

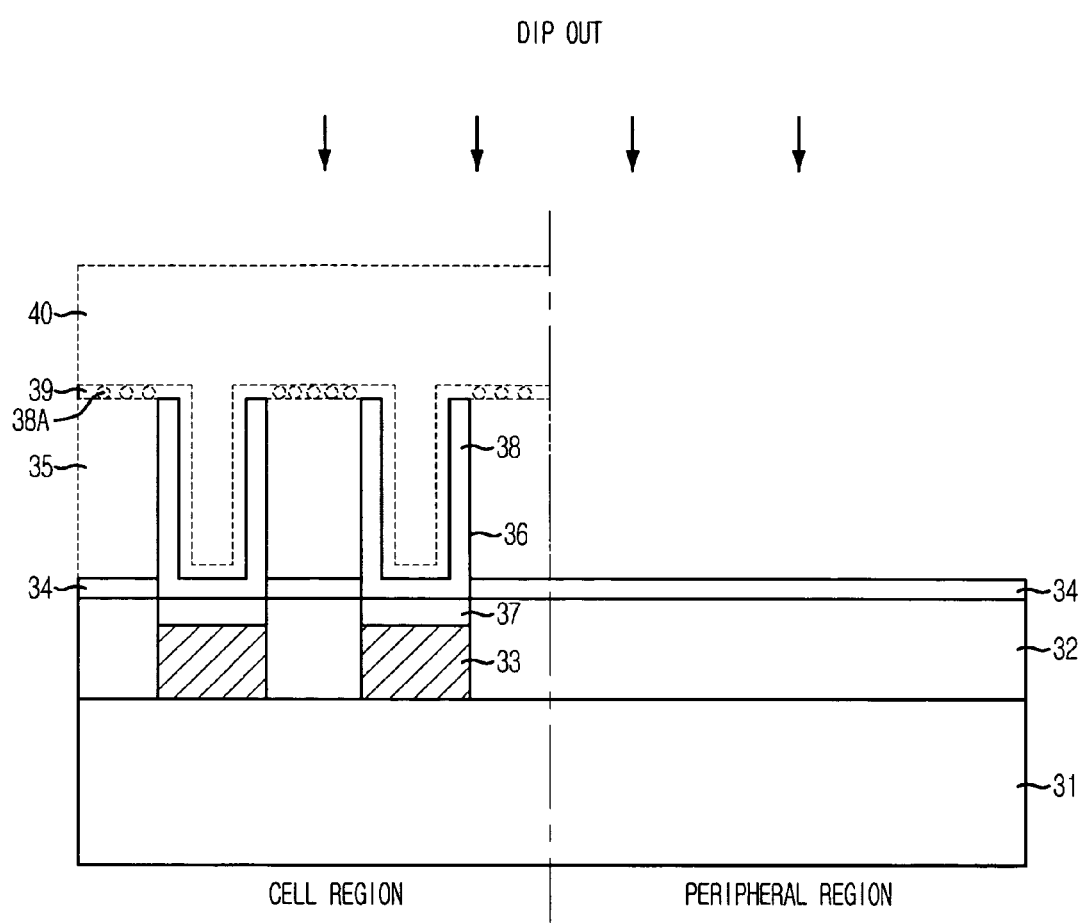

METHOD FOR FABRICATING CAPACITOR IN SEMICONDUCTOR DEVICE

RELATED APPLICATION

The present application is based upon and claims the benefit of priority to Korean patent application Nos. KR 2006-0002139 and KR 2006-0068467, filed in the Korean Patent Office on Jan. 9, 2006 and Jul. 21, 2006, respectively, the entire contents of which are incorporated herein by reference.

TECHNICAL FIELD

The present invention relates to a method for fabricating a semiconductor device, and more particularly, to a method for fabricating a cylinder type capacitor in a semiconductor device.

DESCRIPTION OF RELATED ARTS

As critical dimensions have decreased and the scale of integration has increased in a semiconductor memory device, an area on which a capacitor is formed has gradually become smaller.

Although the area has become smaller, the capacitor in a cell is generally required to secure the minimum required capacitance for each cell. Thus, in order to form the capacitor having a high capacitance on a limited area, a storage node has been formed in three-dimensional forms such as a cylinder type and a concave type, and a metal-insulator-metal (MIM) method has been introduced. Herein, the MIM method refers to forming the storage node and a plate electrode with metal.

FIGS. 1A to 1D are cross-sectional views illustrating a typical method for fabricating a capacitor in a semiconductor device.

As shown in FIG. 1A, a substrate 11 is defined into a cell region and a peripheral region, and an inter-layer insulation layer 12 is formed over the substrate 11. Then, storage node contact holes are formed in the inter-layer insulation layer 12, and storage node contact plugs 13 are formed in the storage node contact holes. Although not illustrated, processes for forming a transistor including word lines and bit lines are generally performed prior to the formation of the inter-layer insulation layer 12. The inter-layer insulation layer 12 is formed in a multi-layer structure.

An etch stop layer 14 and a storage node oxide layer 15 are sequentially formed over the storage node contact plugs 13 and the inter-layer insulation layer 12.

Subsequently, the storage node oxide layer 15 and the etch stop layer 14 are sequentially etched to form trenches 16 exposing top portions of the storage node contact plugs 13.

Barrier metal layers 17 are formed on the storage node contact plugs 13 before forming storage nodes.

A titanium mononitride (TiN) layer is formed over the trenches 16 and etched back to form storage nodes 18 in the trenches 16.

During the etch-back of the TiN layer for forming the storage nodes 18, TiN residues 18A may remain over the storage node oxide layer 15, and may generate micro-bridges between the adjacent storage nodes 18 during a subsequent process, thereby deteriorating device characteristics.

As shown in FIG. 1B, a capping oxide layer 19 (e.g., a plasma enhanced tetraethyl orthosilicate (PETEOS) layer) is formed over the storage node oxide layer 15 and the storage nodes 18. The capping oxide layer 19 is formed to reduce TiN-related defects, i.e., the TiN residues 18A, generated in an alignment and overlay key of the storage nodes 18.

The forming of the PETEOS layer includes forming a silicon oxide layer by supplying a tetraethyl orthosilicate (TEOS) ($Si(OC_2H_5)_4$) source flowing at approximately 800 sccm (standard cubic centimeter per minute) and an oxygen ($O_2$) source flowing at approximately 600 sccm, and supplying a radio frequency (RF) power onto the silicon oxide layer.

However, if conditions of the above operation are applied to the TiN residues 18A remaining after the etch-back process, the TiN residues 18A, silicon (Si) supplied from the TEOS source, and ethyl in the TEOS source are exposed to the RF environment and become entangled over the surface of the substrate structure. The entangled materials remain between the adjacent cylinder type storage nodes after a subsequent full dip out process. The entangled materials still remain between the adjacent cylinder type storage nodes even after the RF power is lowered. When the RF power level changes, a step coverage characteristic of TEOS also changes, generally resulting in a need for resetting the processes.

Referring to FIG. 1C, a mask 20 exposing the peripheral region is formed over the cell region to remove the TiN residues 18A formed in the peripheral region. The TiN residues 18A remaining over the storage node oxide layer 15 in the peripheral region are removed by etching the capping oxide layer 19 in the peripheral region using the mask 20 as an etch barrier.

Referring to FIG. 1D, the mask 20 is removed. The remaining portion of the capping oxide layer 19 in the cell region and the storage node oxide layer 15 in the cell region and the peripheral region are removed to thereby expose inner and outer walls of the storage nodes 18. The storage nodes 18 are cylinder type storage nodes.

According to the above-mentioned typical technology, the TiN residues 18A still remain over the substrate structure after the etch-back process is performed to isolated the adjacent storage nodes 18. The TiN residues 18A may react with plasma in the PETEOS chamber when forming the capping oxide layer 19, i.e., the PETEOS layer, and become a densified material insoluble in a wet chemical used in the removal of the storage node oxide layer 15.

Thus, the TiN residues 18A remain in the cell region after the removal of the storage node oxide layer 15 and connect top portions of the adjacent storage nodes 18, thereby generating micro-bridges as denoted with a reference letter A. The micro-bridges deteriorate device characteristics.

FIGS. 2A and 2B are micrographic views illustrating a micro-bridge. FIG. 2A shows a micro-bridge A' connecting two adjacent cylinder type storage nodes. FIG. 2B shows a great number of such micro-bridges connecting adjacent cylinder type storage nodes.

Defects such as the storage node micro-bridges result in a dual bridge fail after a subsequent device integration process, and need to be reduced when integrating the cylinder type storage nodes (e.g., MIM cylinder type storage node).

SUMMARY

The present invention provides a method for fabricating a capacitor in a semiconductor device, which can reduce a generation of micro-bridges between storage nodes caused by storage node material residues remaining after a storage node isolation process.

A method for fabricating a capacitor in a semiconductor device, consistent with the present invention, includes forming a first insulation layer over a substrate, forming storage node contact plugs in the first insulation layer, contacting predetermined portions of the substrate, forming a second insulation layer over the first insulation layer and the storage node contact plugs, forming trenches exposing the storage node contact plugs, forming storage nodes in the trenches, forming a plasma barrier layer over the second insulation layer and the storage nodes, forming a capping layer over the plasma barrier layer and filled in the trenches, removing the capping layer, the plasma barrier layer, and the second insulation layer, forming a dielectric layer over the storage nodes, and forming a plate electrode over the dielectric layer.

A method for fabricating a capacitor in a semiconductor device, consistent with the present invention, includes defining a substrate into a cell region and a peripheral region, forming a first insulation layer over the substrate, forming storage node contact plugs in the first insulation layer in the cell region, contacting predetermined portions of the substrate, forming a second insulation layer over the first insulation layer and the storage node contact plugs, forming trenches exposing the storage node contact plugs, forming storage nodes in the trenches, forming a plasma barrier layer over the storage nodes and the second insulation layer, forming a capping layer over the plasma barrier layer and filled in the trenches, forming a mask pattern exposing the peripheral region over the capping layer in the cell region, etching the capping layer and the plasma barrier layer in the peripheral region using the mask pattern as an etch barrier, removing the second insulation layer in the cell region and the peripheral region, forming a dielectric layer over the storage nodes, and forming a plate electrode over the dielectric layer.

The methods consistent with this invention reduce microbridges between adjacent storage nodes by forming a layer preventing a direct contact between TiN residues, remaining after a storage node isolation process is performed, and a PETEOS layer, i.e., a capping oxide layer. Generally, an aluminum oxide layer is formed as a plasma barrier layer to cover the TiN residues. Then, the capping oxide layer is formed over the plasma barrier layer. Thus, the TiN residues can be prevented from reacting with plasmas from a PETEOS chamber to form a material insoluble in most chemicals. Certain characteristics of aluminum oxide allow aluminum oxide to be an effective plasma barrier. Aluminum oxide is generally soluble in hydrogen fluoride (HF)-based chemicals. Thus, aluminum oxide generally dissolves when performing a wet dip out process using a HF-based chemical to remove a storage node oxide layer for forming cylinder type storage nodes. The TiN residues can also be removed during the dip out process.

BRIEF DESCRIPTION OF THE DRAWINGS

The above and other features of the present invention will become better understood with respect to the following description of the specific embodiments given in conjunction with the accompanying drawings, in which:

FIGS. 3A to 3E are cross-sectional views illustrating a method for fabricating a capacitor in a semiconductor device consistent with the present invention.

DETAILED DESCRIPTION

A method for fabricating a capacitor in a semiconductor device consistent with the present invention will be described in detail with reference to the accompanying drawings.

FIGS. 3A to 3E are cross-sectional views illustrating a method for fabricating a capacitor in a semiconductor device consistent with the present invention.

Figure 1A:
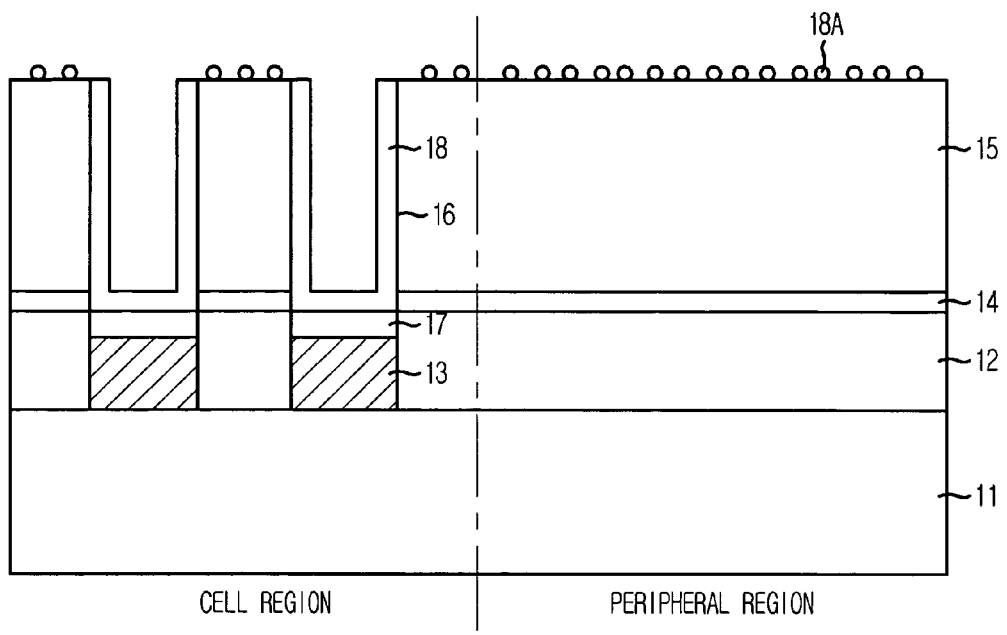
FIGS. 1A to 1D are cross-sectional views illustrating a conventional method for fabricating a capacitor in a semiconductor device.
Figure 1B:
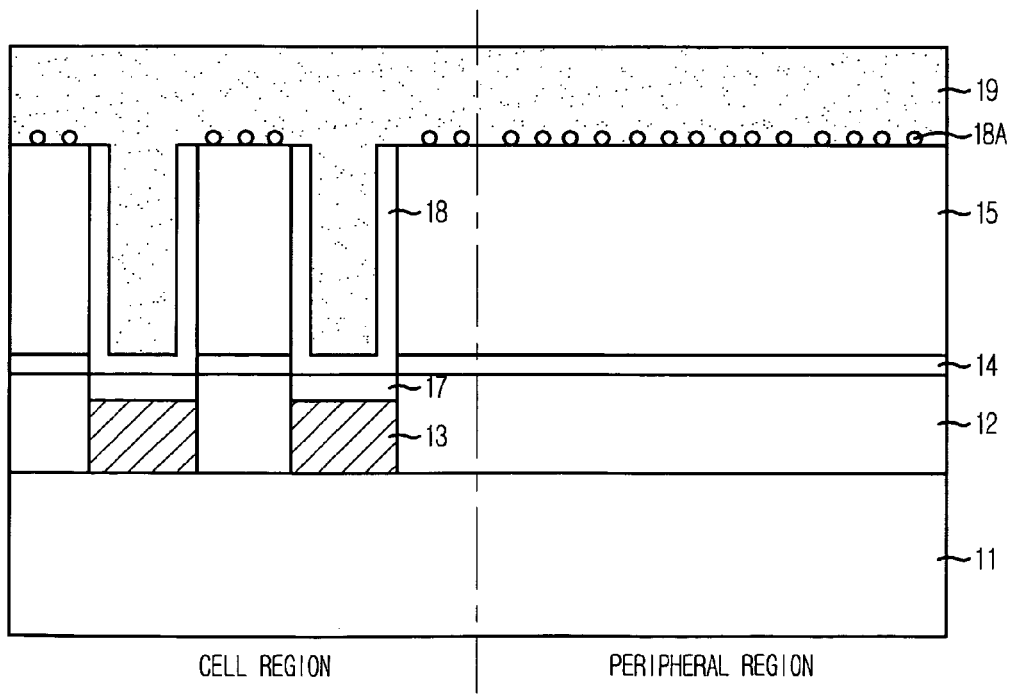
Figure 1C:
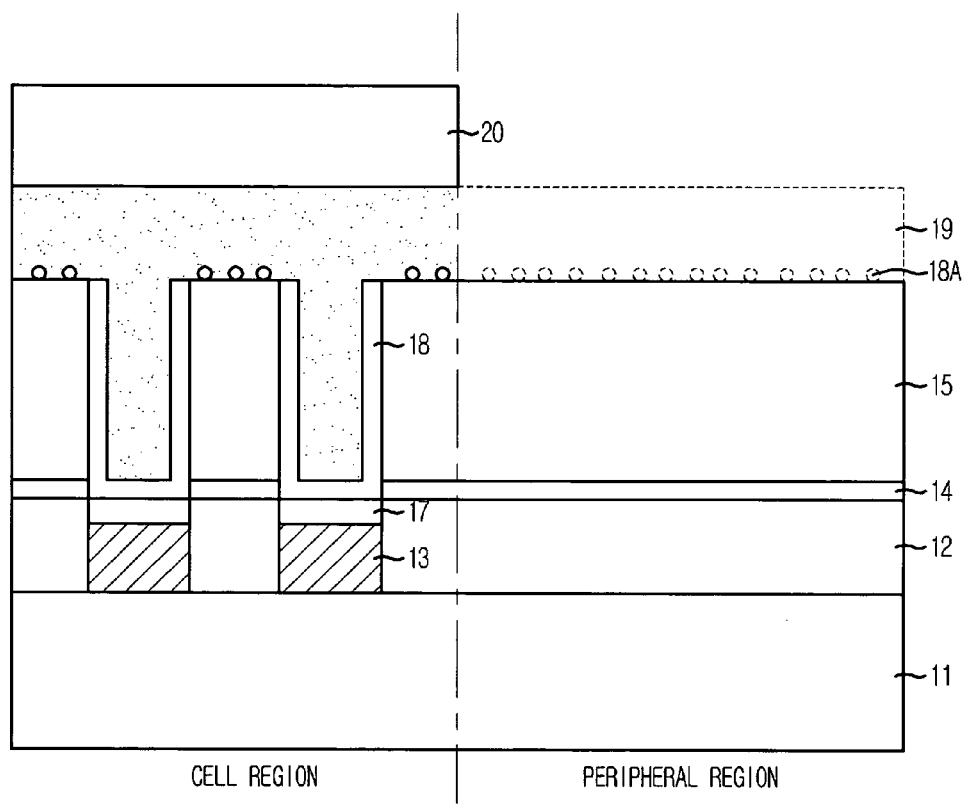
Figure 1D:
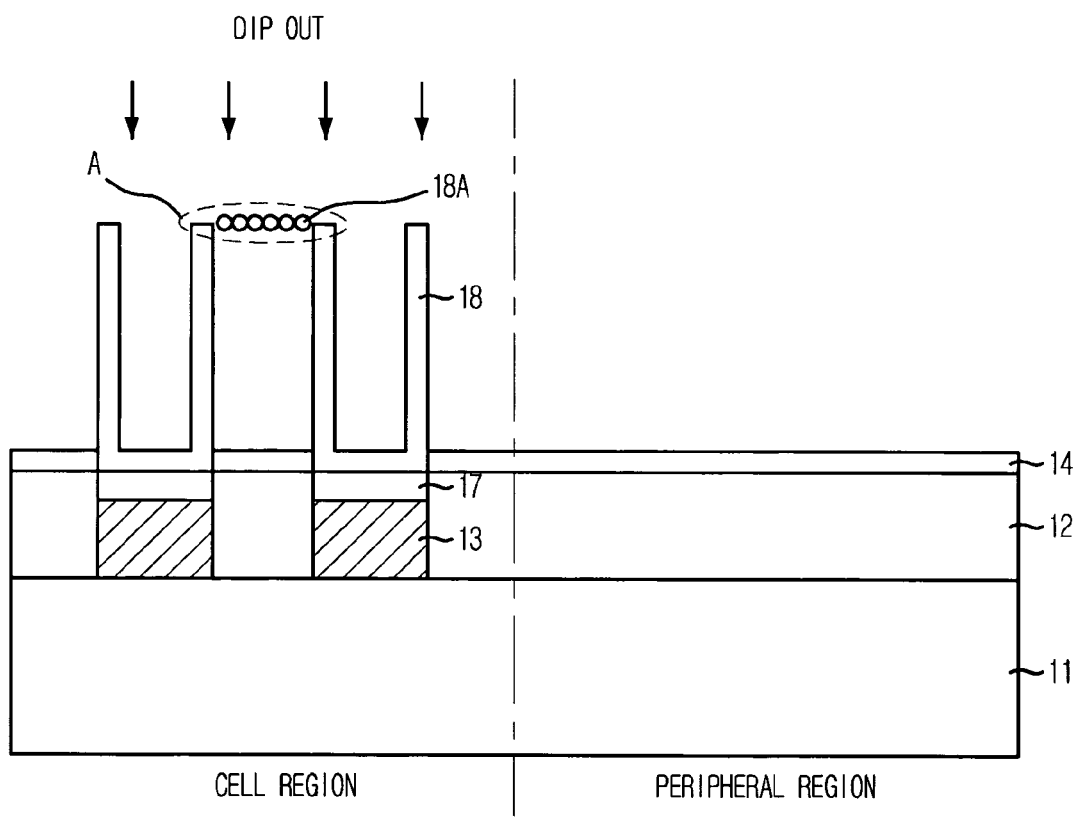
Figure 2A:
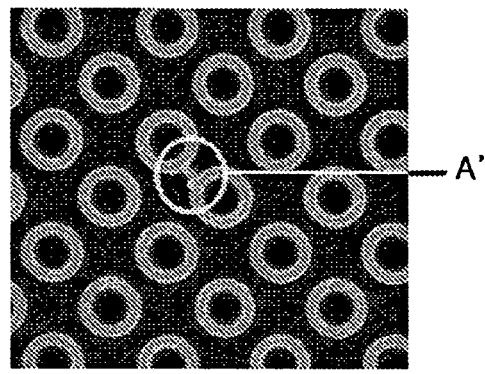
FIGS. 2A and 2B are micrographic views showing microbridges generated by the conventional method.
Figure 2B:
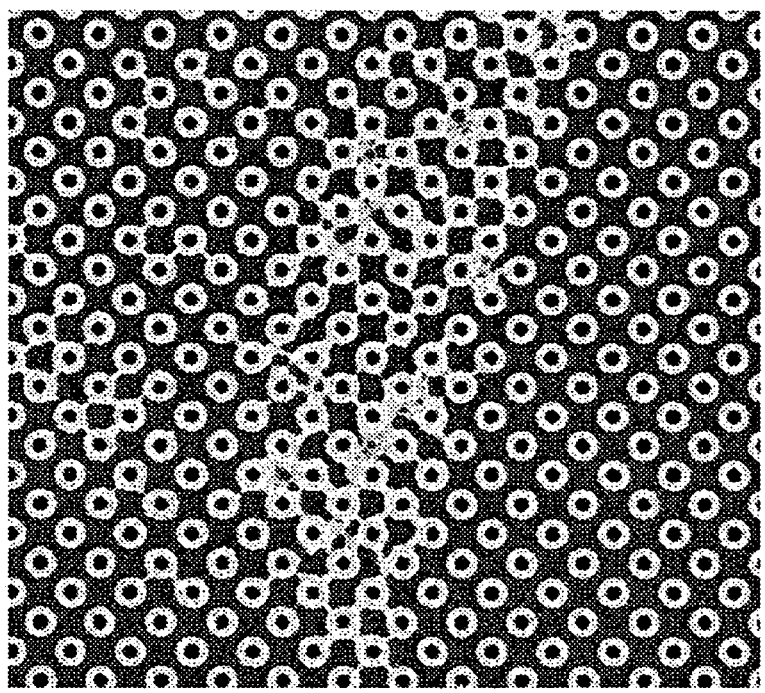
Figure 3A:
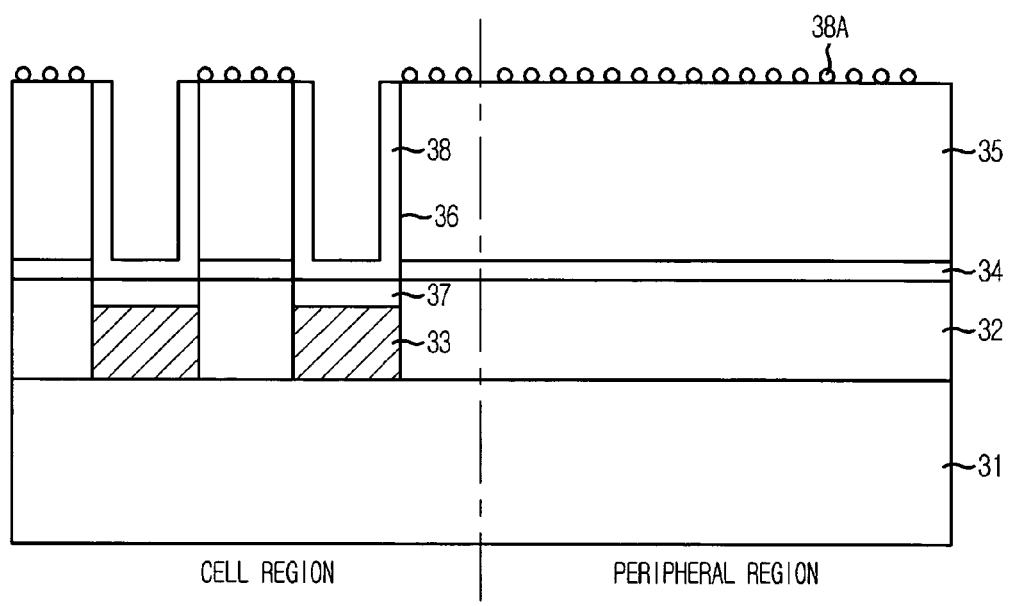

As shown in FIG. 3A, a substrate 31 is defined into a cell region and a peripheral region, and a first inter-layer insulation layer 32 is formed over the substrate 31. Then, storage node contact plugs 33 are formed in the first inter-layer insulation layer 32 in the cell region, contacting predetermined portions of the substrate 31. Although not illustrated, transistors, word lines, or bit lines may be formed before the first inter-layer insulation layer 32 is formed. The first inter-layer insulation layer 32 may comprise one selected from a group consisting of a borosilicate glass (BSG) layer, a borophosphosilicate glass (BPSG) layer, a phosphosilicate glass (PSG) layer, a tetraethyl orthosilicate (TEOS) layer, a high density plasma (HDP) layer, a spin on glass (SOG) layer, and an advanced planarization layer (APL). The inter-layer insulation layer may also have a multi-layer structure including an organic-based or inorganic-based low-k dielectric layer.

The storage node contact plugs 33 may be formed by etching the first inter-layer insulation layer 32 to form storage node contact holes, filling polysilicon in the storage node contact holes, and then planarizing the polysilicon by an etch-back process or a chemical mechanical polishing (CMP) process.

An etch stop layer 34 and a storage node oxide layer 35 are sequentially formed over the storage node contact plugs 33 and the first inter-layer insulation layer 32.

The etch stop layer 34 is formed to function as an etch barrier for reducing damage on the underlying structure during a subsequent dry etching process to be performed onto the storage node oxide layer 35. The etch stop layer 34 may comprise nitride and may have a thickness ranging from approximately 100 Å to approximately 2,000 Å. The storage node oxide layer 35 is formed to provide a three-dimensional structure where storage nodes are to be formed. The storage node oxide layer 35 can be formed as a single oxide layer or to have a multi-layer structure including a chemical vapor deposition (CVD) oxide layer. The total thickness of the etch stop layer 34 and the storage node oxide layer 35 ranges from approximately 6,000 Å to approximately 30,000 Å.

The storage node oxide layer 35 and the etch stop layer 34 in the cell region are sequentially etched to form trenches 36 exposing the storage node contact plugs 33. The trenches 36 are formed by: forming a mask including photoresist patterns over the storage node oxide layer 35; and selectively dry etching the storage node oxide layer 35 and the etch stop layer 34 using the mask as an etch barrier to form the trenches 36 exposing the storage node contact plugs 33. Optionally, a polysilicon hard mask may be used when the storage node oxide layer 35 is thick.

A barrier metal layer 37 is formed on the storage node contact plugs 33. The barrier metal layer 37 may comprise titanium silicide (TiSi), cobalt silicide (CoSi), or zirconium silicide (ZrSi).

In particular, the barrier metal layer 37 may be formed of titanium silicide by depositing titanium (Ti) over the substrate structure using a physical vapor deposition (PVD) or a CVD method; performing a thermal process, i.e., an annealing process, to form titanium silicide; and removing non-reacted portions of Ti by a wet strip process. Herein, the titanium silicide is formed by a reaction of Ti with silicon (Si) in the storage node contact plugs 33, which comprises polysilicon. Thus, the titanium silicide is not formed over the insulation materials adjacent to the storage node contact plugs 33.

By forming the barrier metal layer 37, a resistance of a contact surface between the storage node contact plugs 33 and the subsequent storage nodes can be reduced.

A titanium mononitride (TiN) layer for use as the storage nodes is formed over the trenches 36. Herein, TiN is formed by employing a CVD method or an atomic layer deposition (ALD) method and may have a thickness ranging from approximately 50 Å to approximately 1,000 Å.

A photoresist layer (not shown) filling the trenches 36 is formed over the TiN layer. Herein, the photoresist layer functions as a protection layer for protecting the inside of the trenches 36 during a storage node isolation process. That is, the photoresist layer needs to fill the trenches 36 with a satisfactory level of step coverage before performing the storage node isolation process because impurities such as abrasive materials and etched particles may adhere to the storage nodes 38 during the storage node isolation process.

An etch-back process is performed on the photoresist layer to remove portions of the photoresist layer formed over top portions of the storage node oxide layer 35. Thus, remaining portions of the photoresist layer exist only inside the trenches 36, and portions of the TiN layer formed over the top portions of the storage node oxide layer 35 are exposed.

An etch-back process is performed to remove the portions of the TiN layer formed over the top portions of the storage node oxide layer 35. After the etch-back process, isolated storage nodes 38 are formed. The remaining portions of the photoresist layer inside the trenches 36 are stripped.

TiN residues 38A may remain on the top surfaces of the storage node oxide layer 35 in the cell region and the peripheral region after the storage node isolation process is performed. As discussed above, the TiN residues 38A may generate micro-bridges between the adjacent storage nodes 38 during a subsequent process, and deteriorate device characteristics.

Figure 3B:
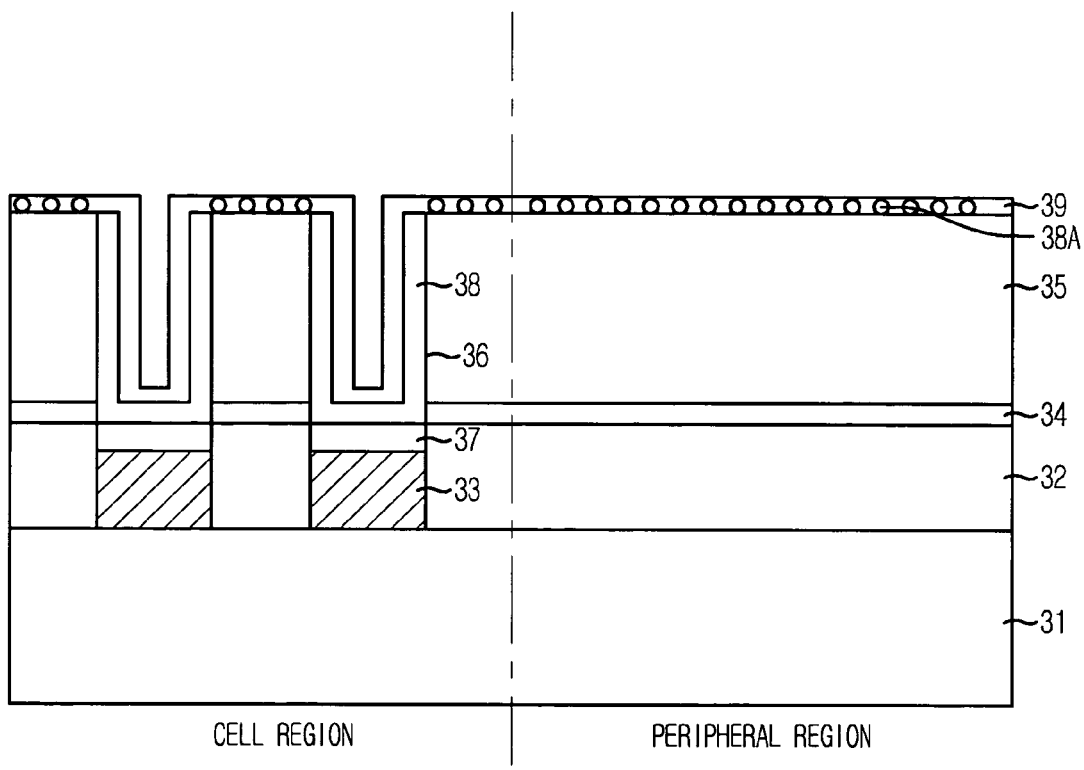

As shown in FIG. 3B, a plasma barrier layer 39 is formed over the storage nodes 38 and the storage node oxide layer 35 to remove the TiN residues 38A. Herein, the plasma barrier layer 39 has a sufficient thickness to cover the TiN residues 38A.

The plasma barrier layer 39 is formed to prevent a direct contact between the TiN residues 38A and a subsequent capping oxide layer, thereby reducing micro-bridges between the adjacent storage nodes 38.

The plasma barrier layer 39 may comprise aluminum oxide ($Al_2O_3$) using a CVD method or an ALD method and may have a thickness ranging from approximately 30 Å to approximately 1,000 Å. If the plasma barrier layer 39 has a thickness below approximately 30 Å or above approximately 1,000 Å, it becomes difficult to remove the TiN residues 38A.

As shown in FIG. 3C, a capping oxide layer 40 is formed over the plasma barrier layer 39. Thus, the TiN residues 38A can be prevented from reacting with plasmas from a PETEOS chamber to form a material insoluble in most chemicals.

Thus, when removing the storage node oxide layer 35 through a hydrogen fluoride (HF)-based wet dip out process to form the cylinder type storage nodes, the TiN residues 38A covered by the aluminum oxide layer, i.e., the plasma barrier layer 39, can also be removed.

The capping oxide layer 40 includes a PETEOS layer. The PETEOS layer may be formed by: flowing tetraethyl orthosilicate (TEOS) (having $Si(OC_2H_5)_4$ as a source) at a rate of approximately 800 sccm and oxygen ($O_2$) at a rate of approximately 600 sccm to form a silicon oxide layer; and supplying a radio frequency (RF) power (to excite plasmas) to the silicon oxide layer to form the PETEOS layer.

A mask 41 exposing the peripheral region is formed over the capping oxide layer 40 over the cell region to remove the TiN residues 38A in the peripheral region. A wet etching process is performed to etch portions of the capping oxide layer 40, the plasma barrier layer 39, and the TiN residues 38A in the peripheral region using the mask 41 as an etch barrier. Thus, the TiN residues 38A remaining in the peripheral region can be mostly removed.

Referring to FIG. 3D, the mask 41 is stripped, and a dip out process is performed onto the substrate structure. The dip out process employs an HF solution or a buffered oxide etchant (BOE) solution.

Through the dip out process, remaining portions of the capping layer 40, the plasma barrier layer 39, and the TiN residues 38A in the cell region, and the storage node oxide layer 35 in the cell region and peripheral region are removed. Consequently, the storage nodes 38 remain in cylinder form having exposed inner and outer walls after the dip out process.

Figure 3E:
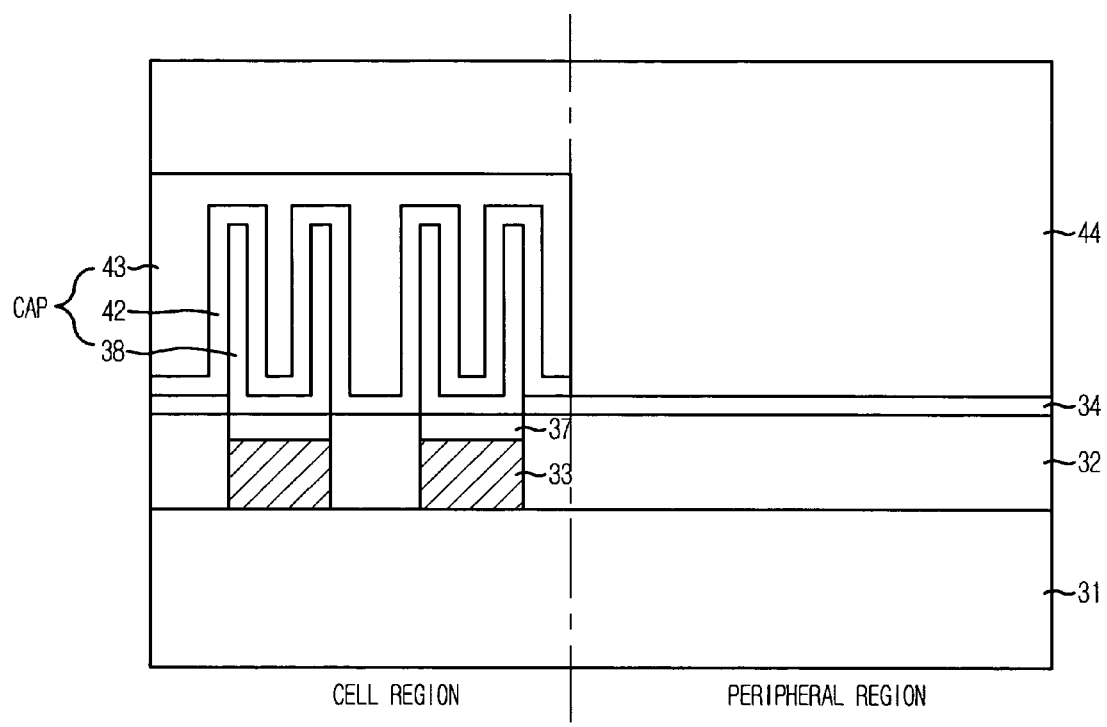

Referring to FIG. 3E, a dielectric layer 42 and a plate electrode 43 are sequentially formed over the cylinder type storage nodes 38 to form a capacitor CAP.

The dielectric layer 42 may comprise one selected from a group consisting of aluminum oxide ($Al_2O_3$), hafnium oxide ($HfO_2$), and a combination thereof, formed by a metal organic CVD or an ALD method, and may have a thickness ranging from approximately 50 Å to approximately 400 Å.

The plate electrode 43 may comprise one selected from a group consisting of TiN, ruthenium (Ru), and polysilicon, formed by a sputtering method, a CVD method, or an ALD method, and may have a thickness ranging from approximately 500 Å to approximately 3,000 Å. A second inter-layer insulation layer 44 is then formed over the substrate structure including the cell region and the peripheral region.

As described above, the aluminum oxide layer, i.e., the plasma barrier layer, covers the TiN residues to remove the TiN residues remaining over the storage node oxide layer after the storage node isolation process. Consequently, the storage node residues can be prevented from reacting with plasmas from the capping oxide layer, i.e., PETEOS chamber, to form a material insoluble in most chemicals. Thus, the micro-bridges between the adjacent storage nodes can be reduced.

Also, the aluminum oxide layer used as the plasma barrier layer, the capping oxide layer, and the storage node oxide layer can be removed together by performing the HF-based wet dip out process because the aluminum oxide layer used as the plasma barrier layer in the cell region is easily soluble in HF-based chemicals. Thus, occurrences of defect in a cylinder type capacitor can be reduced, resulting in a stabilized yield.

Consistent with the present invention, the micro-bridges of the storage nodes can be reduced during a formation process of a cylinder type capacitor (e.g., MIM cylinder type capacitor), and thus, a stabilized yield can be secured.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a capacitor in a semiconductor device, the method comprising:
    forming storage node contact plugs on a substrate;
    forming an insulation layer over the resultant structure;

forming trenches exposing the storage node contact plugs by patterning the insulation layer;

forming a conductive layer over the insulation layer and in the trenches;

forming a photoresist pattern in the trenches to fill the trenches;

etching the conductive layer formed on the insulation layer by performing an etch-back process to form storage nodes in the trenches and form a residue on the insulation layer;

forming a plasma barrier layer over the insulation layer and the storage nodes to cover the residue;

forming a capping layer over the plasma barrier layer and filled in the trenches;

removing the capping layer and the plasma barrier layer containing the residue; and forming a dielectric layer and a plate electrode over the storage nodes.

2. The method of claim 1, wherein the plasma barrier layer comprises aluminum oxide ($Al_2O_3$).

3. The method of claim 2, wherein the plasma barrier layer is formed by one of an atomic layer deposition (ALD) method and a chemical vapor deposition (CVD) method.

4. The method of claim 3, wherein the plasma barrier layer has a thickness ranging from approximately 30 Å to approximately 1,000 Å.

5. The method of claim 1, wherein the capping layer comprises a plasma enhanced tetraethyl orthosilicate (PETEOS) layer.

6. The method of claim 1, wherein removing the capping layer and the plasma barrier layer containing the residue comprises performing a dip out process using one of a hydrogen fluoride (HF) solution and a buffered oxide etchant (BOE) solution.

7. The method of claim 1, wherein forming the conductive layer comprises performing one of a chemical vapor deposition (CVD) method and an atomic layer deposition (ALD) method.

8. The method of claim 7, wherein the storage nodes have a thickness ranging from approximately 50 Å to approximately 1,000 Å.

9. The method of claim 8, wherein the storage nodes comprise titanium mononitride (TiN).

10. A method for fabricating a capacitor in a semiconductor device, the method comprising:

defining a substrate into a cell region and a peripheral region;

forming storage node contact plugs in the cell region of the substrate;

forming an insulation layer over the resultant structure;

forming trenches exposing the storage node contact plugs by patterning a portion of the insulation layer;

forming a conductive layer over the insulation layer and in the trenches;

forming a photoresist pattern in the trenches to fill the trenches;

etching the conductive layer formed on the insulation layer by performing an etch-back process to form storage nodes in the trenches, and to form a residue on the insulation layer;

forming a plasma barrier layer over the storage nodes and the insulation layer to cover the residue;

forming a capping layer over the plasma barrier layer and filled in the trenches;

forming a mask pattern exposing the peripheral region over the capping layer in the cell region;

etching the capping layer and the plasma barrier layer containing the residue in the peripheral region using the mask pattern as an etch barrier;

removing the capping layer and the plasma barrier layer containing the residue in the cell region, thereby removing the entire residue;

removing the insulation layer in the cell region and the peripheral region; and forming a dielectric layer and a plate electrode over the storage nodes.

11. The method of claim 10, wherein the plasma barrier layer comprises $Al_2O_3$.

12. The method of claim 11, wherein the plasma barrier layer is formed by one of an atomic layer deposition (ALD) method and a chemical vapor deposition (CVD) method.

13. The method of claim 12, wherein the plasma barrier layer has a thickness ranging from approximately 30 Å to approximately 1,000 Å.

14. The method of claim 10, wherein the capping layer comprises a plasma enhanced tetraethyl orthosilicate (PETEOS) layer.

15. The method of claim 10, wherein etching the capping layer and the plasma barrier layer containing the residue in the peripheral region using the mask pattern as an etch barrier comprises performing a wet etching process.

16. The method of claim 10, wherein removing the capping layer and the plasma barrier layer containing the residue further comprises removing the mask pattern.

17. The method of claim 10, wherein removing the capping layer and the plasma barrier layer containing the residue and removing the insulation layer in the cell region and the peripheral region comprises performing a dip out process using one of a hydrogen fluoride (HF) solution and a buffered oxide etchant (BOE) solution.

18. The method of claim 10, wherein forming the conductive layer comprises performing one of a chemical vapor deposition (CVD) method and an atomic layer deposition (ALD) method.

19. The method of claim 18, wherein the storage nodes have a thickness ranging from approximately 50 Å to approximately 1,000 Å.

20. The method of claim 19, wherein the storage nodes comprise TiN.

21. A method for fabricating a capacitor in a semiconductor device, the method comprising:

forming an insulation layer over a substrate;

forming trenches by patterning a portion of the insulation layer;

forming a conductive layer over the insulation layer and in the trenches;

forming a photoresist pattern in the trenches to fill the trenches;

etching the conductive layer formed on the insulation layer by performing an etch-back process to form storage nodes in the trenches and form a residue on the conductive layer;

forming a plasma barrier layer over the insulation layer and the storage nodes, wherein the plasma barrier layer has a thickness sufficient to cover the residue;

forming a capping layer over the plasma barrier layer and filled in the trenches;

removing the capping layers, the plasma barrier layer, and the residue;

forming a dielectric layer over the storage nodes; and forming a plate electrode over the dielectric layer.

22. The method of claim 21, wherein the plasma barrier layer prevents a direct contact between the residues and the capping layer.

23. The method of claim 21, wherein the plasma barrier layer prevents the residues from directly contacting a plasma energy used to form the capping layer.

24. The method of claim 21, wherein the plasma barrier layer comprises aluminum oxide ($Al_2O_3$).

25. The method of claim 24, wherein the storage nodes comprise titanium mononitride (TiN).

26. The method of claim 21, wherein the plasma barrier layer is formed by one of an atomic layer deposition (ALD) method and a chemical vapor deposition (CVD) method.

27. The method of claim 21, wherein the capping layer comprises a plasma enhanced tetraethyl orthosilicate (PE-TEOS) layer.

28. The method of claim 21, wherein the removing the capping layer, the plasma barrier layer, and the residue includes:

patterning the capping layer and the plasma barrier layer in a peripheral region; and removing the capping layer, the plasma barrier layer, and the residue in a cell region and the peripheral region.

* * * * *